United States Patent [19]
Codomo et al.

[11] 3,946,364
[45] Mar. 23, 1976

[54] METHOD AND APPARATUS FOR SENSING, STORING, AND GRAPHICALLY DISPLAYING OVER-TEMPERATURE CONDITIONS OF JET ENGINES

[75] Inventors: Joseph Codomo, Bellevue; Eric K. Thorson, Snohomish, both of Wash.

[73] Assignee: Eldec Corporation, Lynnwood, Wash.

[22] Filed: Jan. 8, 1975

[21] Appl. No.: 539,393

[52] U.S. Cl. ............................. 340/172.5; 73/340
[51] Int. Cl.² .................... G06F 1/00; G01K 13/00
[58] Field of Search .......... 340/172.5; 73/340, 342, 73/343.5

[56] References Cited
UNITED STATES PATENTS

| | | | |
|---|---|---|---|
| 3,170,327 | 2/1965 | Powell | 73/343.5 |
| 3,318,151 | 5/1967 | Behrendt et al. | 73/343.5 X |
| 3,587,317 | 6/1971 | Ruof | 73/342 |
| 3,678,486 | 7/1972 | Bickel et al. | 73/340 X |
| 3,688,295 | 8/1972 | Tsoras et al. | 73/340 X |
| 3,699,810 | 10/1972 | Takahashi | 73/342 X |

*Primary Examiner*—Raulfe B. Zache
*Attorney, Agent, or Firm*—Christensen, O'Connor, Garrison & Havelka

[57] ABSTRACT

The required frequency of inspection, servicing and overhauling of jet engines is to a large extent determined by the history of excessive or over-temperature conditions of each engine. In order to monitor and record each such over-temperature condition, an indicator device is provided having electronic circuitry for processing a temperature signal from the jet engine and a light emitting diode matrix for graphically displaying each over-temperature incident. When the jet engine temperature exceeds a threshold over-temperature point, this occurrence is sensed and the circuitry of the indicator functions to automatically store and visually display the engine temperature as a function of time for the succeeding several seconds after the over-temperature condition has commenced. All the diodes of the matrix lying under the temperature versus time profile are energized so as to present a histogram display of the severity of the condition, where the severity is a function of the duration and magnitude of the over-temperature. In one embodiment disclosed herein, a plurality of over-temperature events are automatically sensed, graphically displayed and stored for later retrieval, such that the maintenance crew may subsequently interrogate the indicator device causing it to sequentially display each recorded or electronically stored over-temperature event.

13 Claims, 5 Drawing Figures

3,946,364

METHOD AND APPARATUS FOR SENSING, STORING, AND GRAPHICALLY DISPLAYING OVER-TEMPERATURE CONDITIONS OF JET ENGINES

BACKGROUND OF THE INVENTION

The present invention relates in general to methods and devices for indicating temperatures, and more particularly for indicating and recording excessive temperature conditions of jet engines.

Because of the deleterious effect of excessive temperature conditions on turbine jet engines, the frequency of inspection and maintenance of the engines is to a large extent determined by the history of over-temperature conditions incurred by each engine. Typically, the most significant engine temperatures are the temperatures of the gasses at the inlet and outlet of the turbine and the temperatures of the turbine blades and inlet guide vanes. Accordingly, it is one or more of these temperatures which is usually monitored. If a particular engine has incurred a predetermined number of over-temperature events, then the engine manufacturer specifies that an inspection of the "hot" section of the engine shall be performed. If no visual distress is found, the engine may continue in service for a specified period of time, after which the engine must be replaced and overhauled. Of course, if visual distress is located during the inspection, then the engine must be replaced at that time.

In general, the number of over-temperatures allowed before mandatory inspection and/or replacement has been heretofore established without regard to the time duration during which the engine operated at the excessive temperature. However, the likelihood of damage or distress to the engine is a function not merely of the over-temperature, but also of the magnitude and time duration of the over-temperature. In other words, an engine which has incurred a total of ten over-temperature events, each being for a relatively short time duration, is less likely to have incurred dangerous distress as an engine which has been subjected to five over-temperature conditions, each of excessive time duration. Accordingly, the severity of the over-temperature condition is most reliably and accurately determined by monitoring both the magnitude and the duration of the exhaust gas overtemperature.

In the past, flight instruments for monitoring the "hot" sections of the engines have not been capable of accurately recording the temperature versus time characteristics of the over-temperature event. This is particularly so where the flight engineer is required to monitor and record the duration of the excessive temperature incident. In many instances, particularly where an engine has entered a compressor stall condition, the flight deck engine instruments may not be monitored closely enough to accurately determine the time versus temperature parameters of an over-temperature occurrence. Any uncertainty as to the severity of the over-temperature event may lead to unnecessary and costly maintenance action, by erring on the side of safety, or worse, failure to perform timely maintenance. It is thus extremely important to accurately monitor and record every over-temperature condition and it would be desirable to record the precise temperature magnitude versus time duration characteristics of the event. Knowledge of the peak temperature reached and the length of time the engine temperature was above the over-temperature threshold are critical factors in safe and yet economically efficient determination as to the frequency of engine inspections and overhauling.

In addition to the absence of an accurate recording of the temperature versus time characteristics of an over-temperature event, flight deck instruments, heretofore, have not presented the temperature versus time information in a manner which is easily, quickly read and assimilated by the flight engineer. In some cases, the temperature event may be so excessive and so severe, that instantaneous notice of the event to the flight crew is critical. Merely providing a temperature indication which must be watched over a time interval of several seconds, does not provide a reliable interface between the instrument and the operator.

SUMMARY OF THE INVENTION AND ITS OBJECTIVES

Accordingly, it is an object of the present invention to provide method and apparatus for automatically sensing, displaying, and recording one or more over-temperature events exhibited by a jet engine in a manner which overcomes the foregoing disadvantages of prior instruments.

It is another object of the present invention to provide a compact, electronically energized, graphical display of the temperature versus time characteristics of each such over-temperature event.

Still a further object of the present invention is to provide a light emitting diode matrix display of such graphical information.

Additionally, it is an object of the present invention to provide a compact, electronically energized, solid state graphical display of a jet engine over-temperature condition in which the graphical information is presented in a format which instantaneously informs the operator of the temperature versus time severity of the event.

Also it is an object of the present invention to automatically, electronically record each of a plurality of over-temperature events, for subsequent retrieval and graphical display of the magnitude of temperature versus time for each such event.

Briefly, these objects are achieved in the preferred embodiments of the invention disclosed herein by a light emitting diode (LED) matrix controlled by electronic timing and digital storage circuitry which receives and processes an electrical signal representing the magnitude of a salient engine temperature, such as the turbine inlet or exhaust gas temperature. This circuitry detects the commencement of an over-temperature condition and begins to digitally store the instantaneous temperature magnitude at each of a plurality of succeeding time intervals. This digitally stored temperature versus time information is thereupon graphically presented by selectively energizing the appropriate rows and columns of the LED matrix. In the disclosed embodiments herein, the temperature is displayed on the vertical axis of the matrix while time is represented along the horizontal axis.

It is a feature of this indicator that the LED matrix is energized so as to light up all of the matrix diodes lying under the temperature versus time profile so that a histogramlike graph of the information is presented. Accordingly, the intensity of the LED display, that is the number of diodes energized, is a function of the severity of the temperature versus time characteristics of the engine's over-temperature condition. The flight engineer or maintenance operator can quickly inspect each displayed over-temperature event and assimilate the severity of the incident by the overall intensity of the display. Closer inspection will reveal the maximum temperatures reached by the engine and the time duration over which the excessive temperatures occurred.

Furthermore, the temperature versus time information for each event is automatically recorded in the electronic storage portion of the circuitry and is available for subsequent retrieval and display. Thus, for an embodiment of the invention in which a plurality of over-temperature events are sensed and recorded, the maintenance crew may interrogate the indicator apparatus at predetermined intervals, each interrogation presenting a sequential display of each prerecorded overtemperature incident. Furthermore, the digitally stored data may be transmitted from the indicator to a permanent recording medium, such as magnetic tape or the like, for subsequent analysis on the ground.

These and further objects, features and advantages of the method and apparatus according to the present invention will become apparent to those skilled in the art from a consideration of the following detailed description and appended drawings of particular and preferred embodiments of the invention.

DESCRIPTION OF THE PREFERRED EMBODIMENTS

Figure 1:
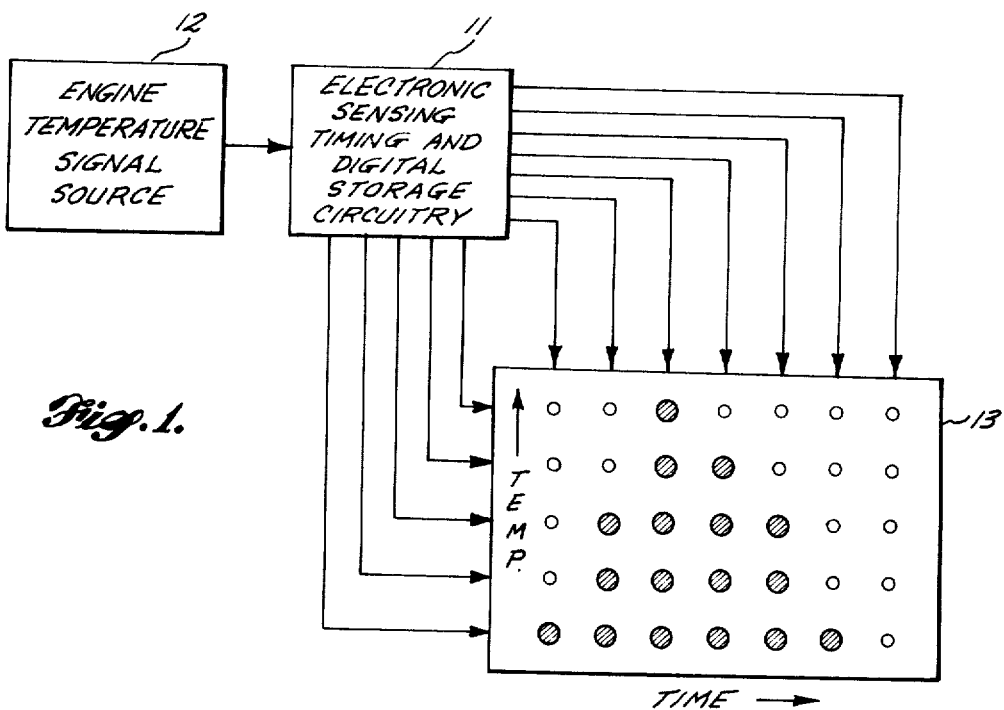
FIG. 1 is a generalized block diagram of the indicator apparatus constructed in accordance with one preferred embodiment of the invention and showing the light emitting diode (LED) graphical display matrix.
Figure 5:
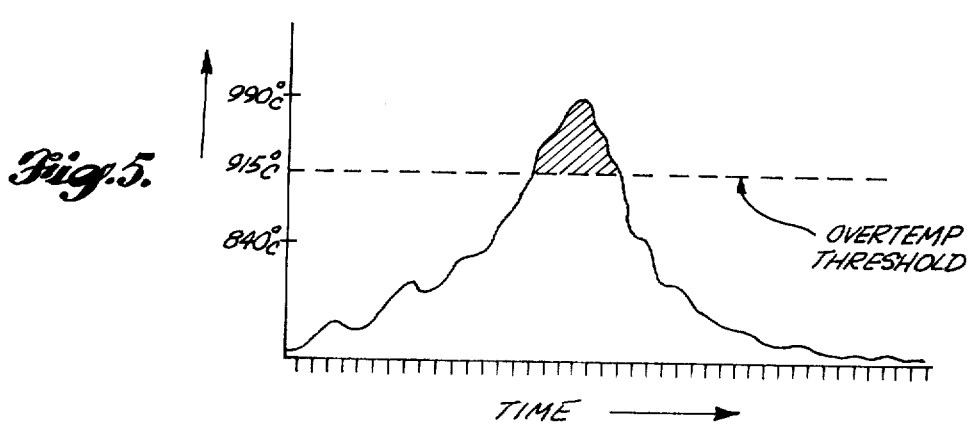
FIG. 5 is a graph showing an engine temperature as a function of time and illustrating a brief over-temperature condition of the type monitored by the instrument of the present invention.

With reference to FIGS. 1 and 5, the method and apparatus of the present invention may be embodied in an instrument including electronic circuitry 11 for receiving a signal from source 12 representing an instantaneous temperature condition in a jet turbine engine, and a light emitting diode (LED) display matrix 13 connected to circuitry 11 for visually, graphically displaying certain temperature versus time characteristics of the monitored engine temperature. In particular, and as mentioned hereinabove, reliable and safe operation of the aircraft engine requires careful monitoring and recording of the occurrence of any excessive engine temperatures.

Typically, a specified maximum temperature is designated for each type of engine. If the temperature exceeds this maximum level, such an occurrence is referred to as an over-temperature event. Thus, for example as illustrated in FIG. 5, the specifications for a particular engine may designate a maximum or over-temperature threshold at 915° C. Any temperatures exceeding this level are referred to as over-temperatures. An over-temperature event is defined as the engine temperature condition from the time that the temperature rises across the maximum or over-temperature threshold to the time that the temperature subsides to a level below the over-temperature threshold. The characteristics of the temperature level as a function of time during any given overtemperature event are extremely informative as to the degree of possible engine damage.

In accordance with the apparatus shown in FIG. 1, display matrix 13 is operated so as to visually display the temperature versus time characteristics of each over-temperature event. For example, display 13 will present a visual representation of that portion 14 of the temperature versus time characteristic shown in FIG. 5 which lies above the over-temperature threshold 16. Moreover, the digital storage portion of circuitry 11 together with display 13 provides for recording or electronically memorizing the temperature versus time data for each such over-temperature event, so that this data can be retrieved at a later time for analysis.

Figure 4:
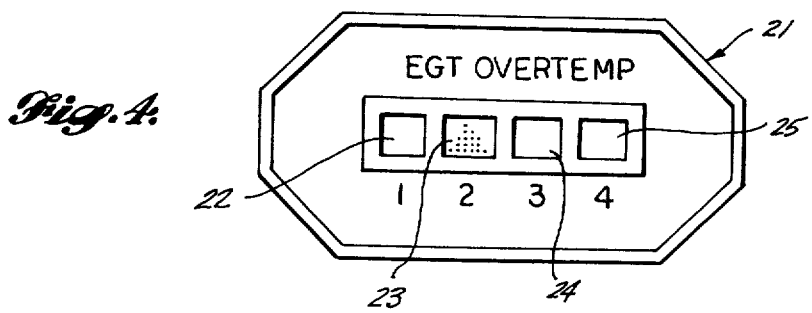
FIG. 4 is an elevation view of one preferred instrumentation panel for installation in an aircraft and here including a plurality of LED matrix displays, one for each aircraft engine.

For an aircraft having a multiplicity of jet engines, the apparatus may be embodied in an instrument including a plurality of display matrices, one matrix for each engine. This embodiment is illustrated in FIG. 4, wherein an instrument display panel 21, which may be mounted on the instrument deck in the cockpit, includes display matrices 22, 23, 24 and 25 associated with engines Nos. 1, 2, 3 and 4. Each such matrix may be associated with a separate electronic circuit corresponding to circuitry 11 for receiving and processing a temperature signal from a corresponding one of the aircraft engines. As discussed more fully herein, if desired, certain components of electronic circuitry 11 may be used in common with the plurality of matrices 22 through 25 on a time-sharing basis.

In the particular embodiments of the invention disclosed herein, the LED display matrices, such as matrix 13, are formed by a 5-by-7 diode array with the vertical columns representing the temperature level and the horizontal rows corresponding to the elapsed time. It will be appreciated that any desired number and format of the LED array may be employed. It has been found that the 5-by-7 dot array is suitable for graphically displaying an over-temperature event in which the over-temperatures range from a lower, over-temperature threshold of 915° C. to an upper temperature of 990° C. as shown in FIG. 5. The time base along the horizontal axis or rows has been selected in this instance to provide an elapsed time of zero to six seconds. This time duration has been found adequate for recording and displaying transient over-temperature events of marginal severity. Events which take place over a time period of less than one second are usually not critical, and in such cases it is merely necessary to register the fact the event did occur.

On the other hand, over-temperature events which exceed six seconds of elapsed time are usually so severe that testing and servicing of the engine is mandatory. In between these extremes, the degree of severity of the over-temperature event is marginal, and the graphical display and recording of each such event by the method and apparatus of the present invention substantially eliminates any uncertainity as to whether or not an inspection of the hot section of the engine is required.

Further in accordance with the present invention, display matrix 13 not only graphically displays a temperature versus time profile of the over-temperature event, but also automatically engerizes all of the light emitting diodes lying under the profile as illustrated in FIG. 1 so as to display a histogram of the event. As previously mentioned, the severity of the over-temperature event is proportional to the integral of the temperature as a function of the elapsed time. In other words the severity depends upon the area lying under the temperature versus time curve, and the histogram display of this area by matrix 13 as shown in FIG. 1, presents an instant visual indication of the seriousness of the over-temperature occurrence.

In this regard, it will be observed that the overall intensity of the display, even apart from the temperature profile, presents a rough indication of the degree of potential engine damage. If the majority of the light emitting diodes are energized on the matrix, then a quick, cursory look at the instrument panel will reveal a serious condition. On the other hand if only a few of the diodes are illuminated, this will indicate a far less severe over-temperature event.

Figure 2:
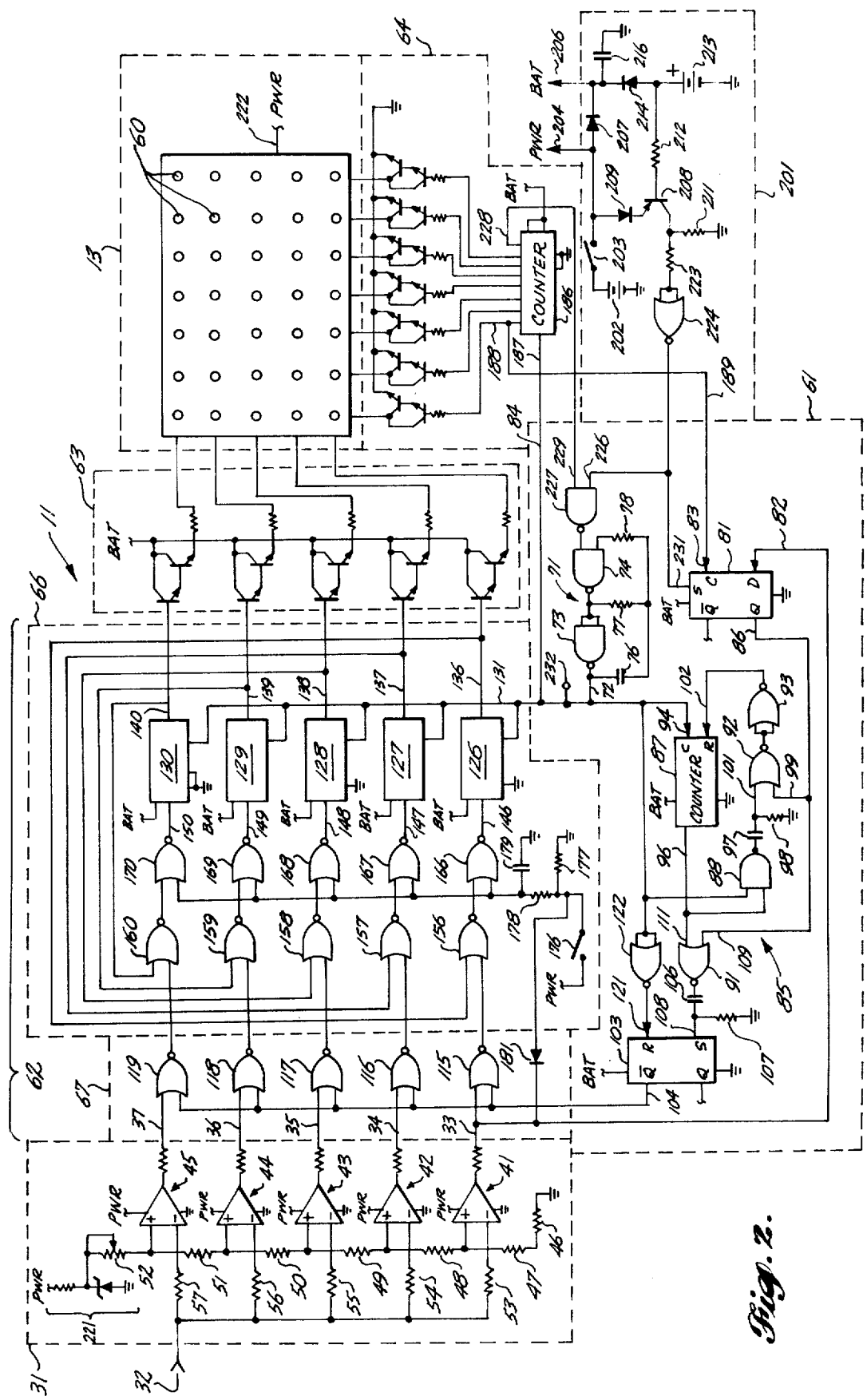
FIG. 2 is a detail schematic diagram of the LED display matrix and the electronic sensing, timing and digital storage circuitry of the indicator apparatus of FIG. 1.

With reference to FIG. 2, one particular embodiment of electronic circuitry 11 and diode matrix 13 is illustrated for sensing, recording and displaying the worse or most severe over-temperature event during a single flight. During such flight, when the first over-temperature event occurs, the circuitry functions to record and display the temperature versus time characteristics thereof. This data is stored in the digital storage portion of the circuitry. If subsequently another over-temperature event occurs during the flight, the circuitry will record and display its temperature versus time parameters only to the extent that they exceed the levels of the previous event. In other words only if the second or any other succeeding over-temperature event is more severe than the previous over-temperature events, will the additional temperature data be recorded and displayed. Thus at the end of the flight, only the accumulated "worse" over-temperature event will be recorded in circuitry 11 and displayed on matrix 13.

For this purpose circuitry 11 as shown in FIG. 2 may include an analog-to-digital converter means, here provided by converter 31 adapted to receive an electrical analog signal at an input 32 representing the instantaneous temperature of a hot section of the jet engine. Any suitable and well known source may be utilized for developing this temperature signal. For example, a thermal-couple or other electro-thermal transducer may be placed in a heat exchange relationship with the turbine inlet or exhaust gasses of the engines so as to monitor the most temperature critical sections of the engine which are generally represented by these temperatures. Typically, the aircraft will already be equipped with standard instrumentation for providing the necessary electrical analog signals representing the engine temperatures. Thus installation of the indicator constructed in accordance with the present invention, will generally require the mere connection of input 32 to the standard or pre-existing aircraft instrumentation.

Converter 31 changes the analog signal to a multiple bit digital signal available at the parallel outputs 33, 34, 35, 36 and 37 from converter 31. In the alternative, the temperature signal available from the standard aircraft instrumentation may already be in a digital format. In such case, converter 31 may be bypassed and the digital temperature signal may be fed directly, or indirectly through suitable code conversion, to outputs 33 through 37.

Means are provided in conjunction with converter 31 for sensing the occurrence of an over-temperature condition of the engine temperature signal. In this instance, such means is provided by a comparator network 41 of converter 31 which senses the lower temperature threshold of the input analog signal. Similar comparator networks 42, 43, 44 and 45 are conditioned along with network 41 by a resistive voltage divider network formed of serially connected resistors 46 through 51 and variable resistor 52 and by parallel connected input resistors 53 through 57 to respond to successively higher threshold levels of the input analog signal.

Network 41 is conditioned to respond to an electrical signal representing a threshold over-temperature condition and upon such occurrence its associated output 33 switches in this embodiment from a low to high logic level thus indicating that the engine has commenced an over-temperature event. A continuing rise of the engine temperature causes successive switching of networks 42 through 45 such that the most excessive over-temperature will cause all of the outputs 33 through 37 of converter 31 to assume a logic high condition.

As soon as converter network 41 signals at output 33 that the engine temperature is entering an over-temperature event, a time-based generator circuit 61 is actuated. Circuit 61 is connected to a digital storage circuit 62 and to display matrix 13 and provides a means for conditioning these components to store and display the digital temperature signal at each of a plurality of time intervals following the start of the over-temperature event. For example and as mentioned above, the diode matrix 13 may be provided with a time base along the rows or horizontal axis thereof representing a time span of approximately zero to six seconds. Accordingly, seven columns of light emitting diodes are provided in the present embodiment with the first column representing "zero" time and the succeeding columns representing increments or intervals of one second, on up to the last column which carries the temperature information for the sixth second of elapsed time.

The individual diodes 60 of a matrix 13 may be selectively energized in a known manner by the coincidence of a horizontal or row signal developed by an output of row driver 63, and a vertical or column signal produced by one of the outputs from column driver 64. In order to electrically energize matrix 13 so as to present a visual display, it is necessary to repetitively energize those diodes forming part of the display by cyclically operating column driver 64 so as to briefly, successively energize each of the column drive lines leading to the matrix. If in coincidence with this column drive sweep, one or more of the row driver outputs is energized in accordance with a digital temperature signal carried in digital storage 62, then the corresponding diodes of matrix 60 will be illuminated.

Digital storage circuit 62 may be formed of a recirculating, multiple stage shift register 66 having its output connected to and for operating row driver 63, and a data entry gate circuit 67 connected between the outputs of converter 31 and the inputs of shift register 66. At the command of the time-based generator circuit 61, gate circuit 67 allows entry of the digital temperature data from converter 31 into the parallel stages of shift register 66 for recirculating storage therein.

More particularly, time-based generator circuit 61 includes a master clock generator circuit, indicated at 71, producing a sequence of clock signals at output 72 and establishing the fundamental clock frequency of the circuitry. Although clock generator 71 may be provided by any number of suitable circuits, in this instance it is formed by a NAND gate 73 connected as an inverter, a NAND gate 74 and a feedback network including a capacitor 76 and a pair of resistors 77 and 78 selected to provide a clock frequency in this instance of approximately 2049 Hz. This clock frequency is not critical and is selected for scanning matrix 13 at a sufficiently rapid rate to develop a visually perceivable light pattern on the display.

A start bistable multivibrator device 81 has an input 82 which is enabled by comparator network 41 each time an over-temperature event is sensed thereby. Once device 81 has been enabled in this manner, it is switched to its on state by the succeeding clock signal applied at clock input 83 thereof from the first column drive signal developed by column driver 64. This synchronizes the ensuing operation of the circuitry to the scanning sequence of matrix 13 as determined by the response of column driver 64 to the clock signal output from generator 71 available to the column driver over a line 84. As soon as device 81 switches to its on state, a Q output 86 thereof assumes a logic low condition which enables a time-based counter circuit 85 formed of a counter 87, a NAND gate 88, NOR gates 91 and 92, and an inverter 93. A clock input of counter 87 is connected to receive the master clock signals from generator 71 as indicated.

Counter 87 together with gates 88, 91, 92 and inverter 93 serves to divide the clock frequency from generator 71 into a time-base appropriate for actuating the date entry control circuit 67 at different times in the memory cycle of shift register 66 so that each new incoming over-temperature digital signal is stored in a different or unique shift register location. Also the frequency division serves to produce the desired time increments between each of the columns on matrix 13, by counting out a sufficient number of clock pulses from generator 71 in order to make up the one second increments or intervals.

As an example of this operation, the present embodiment provides for dividing the clock frequency from generator 71 by a factor equaling $8n + 1$. The factor $8n$ is selected to reduce the relatively high frequency of pulses from generator 71 down to the desired time-base increments of one second for matrix 13. As indicated above the frequency of generator 71 is relatively high, in this instance being 2049 pulses per second in order to achieve the desired scanning of matrix 13. This relatively high frequency is divided down to the desired time base level by selecting integer $n$ to equal 256 such that counter 87 counts out $8 \times 256 = 2048$ clock pulses at input 94 before its output 96 switches from a logic low to a logic high level.

In order to cause the time-based counter to divide by this factor $8n$ plus 1 in the above formula, the additional circuitry including gates 88, 91, 92 and inverter 93 are provided. After the counter 87 has counted out the factor $8n$ (e.g. 2048 clock pulses) the output 96 goes high, enabling NAND 88 to respond to the next succeeding clock pulse from source 71. Upon the next clock pulse, gate 81 switches and sends a logic pulse to NOR gate 92 through a leading edge detector including capacitor 97 and resistor 98.

One input 99 of NOR gate 92 is enabled by the Q output 86 of bistable device 81 so long as the aircraft engine remains in an over-temperature condition. Accordingly, after counter 87 has register its principal count of $8n = 2048$ clock pulses, the next clock pulse from generator 71 is passed by gate 88, through the differentiation network, to input 101 of NOR gate 92 and from there through inverter 93 to a reset input 102 of counter 87. This resets counter 87 to a zero state and output 96 resumes its low logic condition.

The clock pulse which thus causes counter 87 to be reset, corresponds to the additional or plus 1 count in the above formula, and enables the shift register 66 to be advanced one additional count over the above the preceding register cycle for opening up a new and unique register location for receiving a new or revised over-temperature digital signal from converter 31. More particularly this occurs by the provision of a one-shot multivibrator device 103 which operates data entry circuit 67 in response to the output of the time-base counter available from NOR gate 91.

One-shot device 103 includes a $\overline{Q}$ output 104 connected to and for enabling the various data entry gates of circuit 67. An output from NOR gate 91 is connected through a differentiation circuit including capacitor 106 and resistor 107 to a set input 108 of device 103. When the output 96 of counter 87 goes to a logic high in response to the registration of $8n$ clock pulses, NOR gate 91, previously enabled at an input 109 by device 81, responds to this counter output change at an input 111 whereupon the output of NOR gate 91 goes to a logic low and through the differentiation circuit triggers the S input 108 of device 103. Responsively, device 103 through its output 104 enables NOR gates 115 through 119 of circuit 67 allowing entry of the digital time word or signal. The next succeeding clock pulse resets counter 87 as discussed above and also resets device 103 at input 121 through an inverter 122.

Concurrently with the foregoing operation, a plurality of parallel register stages 126 through 130 of shift register 66 is rapidly cycled by the master clock signal appearing on line 131 and jointly fed to the individual clock inputs of the shift register stages. A separate stage is provided in this instance for each digital bit making up the digital temperature word or signal from the plurality of outputs 33 through 37 of converter 31. Recirculation of the data in these shift register stages is achieved by connecting their various outputs 136 through 140 back to the inputs 146 through 150 of the various stages via NOR gate 156 through 160 and NOR gates 166 through 170. So long as data entry control circuit 67 is not enabled by the time-based counter circuit, the same data carried in each of the bit locations of stages 126 through 130 is continuously recycled between the outputs and inputs thereof by the continuously running clock generator 71.

Whenever data entry control circuit 67 is enabled by the time-based counter via one-shot device 103, NOR gates 115 through 119 allow entry of the over-temperature word represented by the bit condition on outputs 33 through 37 into the shift register 66 through NOR gates 156 through 160 and 166 through 170, where the temperature information is recorded or memorized. The memory of shift register 66 may be erased by closing a reset switch 176 which is effective through a resistive capacitive network including resistors 177 and 178 and a capacitor 179 to introduce zero or low logic bits into register stages 126 through 130 while such stages are clocked by generator 71. Simultaneously with the erasing of register 66, switch 176, through diode 181 disables the over-temperature sensing comparator 41 at output 33 and thus also disables start multivibrator device 81 to insure that an over-temperature condition does not prematurely start the time-based counter and cause entry of spurious temperature data.

Switch 176 may be manually actuated so that the instrument can be erased on the flight deck instrument panel.

Continuous recycling of shift register 66 selectively presents the digital temperature information on outputs 131 through 140 for selective energization of various horizontal rows of matrix 13. For this purpose, additional energizing power for driving the light emitting diodes in matrix 13 is provided by row driver 63 which in this embodiment is formed of a plurality of high gain (piggy-back) transistor drivers as illustrated.

In order to selectively actuate only certain of the diodes of matrix 13, the scanning or sweeping of the matrix columns must be accomplished in synchronism with the cycling of shift register 66. Here this is achieved by clocking a column drive counter 186 at its input 187 over line 184 from the master clock generator 71. Synchronism of counter 186 is achieved by clocking start multivibrator device 81 at input 83 thereof as the first column output 188 is energized by counter 186. Since the counter is continuously running in response to generator 71, as soon as the counter assumes the state in which output 188 is energized, device 81 is switched by a signal on line 189, having been previously enabled for such switching by an over-temperature sense signal at input 82. The clock pulse which thus causes counter 186 to energize output 188, also causes the storage of a digital temperature word associated with this first column time by switching one-shot device 103 via NOR gate 91 as the Q output 86 of device 81 goes low. Note that this operation of one-shot 103 occurs before counter 87 has registered the usual number of 8n clock pulses so that the temperature level occurring at the instance an over-temperature event commences, is recorded in the shift register and displayed on matrix 13.

In an alternative embodiment, the time-based counter circuitry may be modified so as to allow data entry only after the elapse of the first pre-established time increment following a sensed or detected over-temperature condition. Thus the over-temperature condition may be first detected and then the over-temperature level existing one second later may be recorded following the clock pulse division operation of counter 87.

Concurrently with the entry of data at the commencement of the over-temperature event, counter 87 is reset by means of NOR gate 92 and inverter 93 in response to the output 86 of device 81 going to its low condition. This synchronizes the time-based counter with the column probe or sweep counter 186 and the location of the temperature data in shift register.

Column driver 64, like row driver 63, is provided with a plurality of piggy-backed, high gain, transistor drivers as illustrated for suitable energization of the light emitting diodes of matrix 13 in response to the outputs of counter 186.

It will be observed that in this particular embodiment circuitry 11 functions to record a worse case representation of a plurality of successive over-temperature events. For example if during a single flight, more than one over-temperature event occurs, then the operation of the circuitry is as follows. The first over-temperature event will cause storage of a certain temperature versus time profile in shift register 66 and display this profile on matrix 13. Now assume that the first event expires, by reason of the engine temperature dropping below the over-temperature threshold, and subsequent thereto another engine over-temperature occurs.

When this happpens, the operation of NOR gates 156 through 160 provides for entering the instantaneous over-temperature digital word from converter 31 and circuit 67, only in the event that such over-temperature exceeds the previously recorded over-temperature. Thus let's assume that stages 126 and 127 have recorded a high logic over-temperature bit at a particular time slot within the shift register cycle. For the same time slot, stages 128 through 130 carry a low or zero temperature bit indicating that at that particular time in the previous cycle, the over-temperature exceeded the threshold of network 42 but did not reach the thresh olds of network 43 and of the succeedingly higher networks 44 and 45. If the new temperature signal exceeds the thresholds of gates 43, 44 or 45 then it is recorded. Thus the new temperature data modifies the previously recorded data only to the extent that it exceeds the previous temperature levels for the corresponding time intervals. Accordingly, at the end of a flight, digital storage 62 and matrix 13 will have recorded and will display a superimposed "worse" case over-temperature profile composed of one or more over-temperature events. If desired, the number of such over-temperature events can be monitored in a manner described in another embodiment of the invention disclosed herein, so that the indicator may also record and display along with the composite temperature versus time histogram, the number of over-temperature events making up the composite display.

To insure the retention of the temperature versus time data in digital storage 62 in case electrical power in the aircraft is interrupted or completely lost, a self-contained memory battery circuit 201 may be provided. The usual or normal aircraft electrical power is provided from a source 202, shown here as a battery, and applied to the instrument through a power switch 203. Usually source 202 will be a power generator carried by the aircraft rather than a battery. When switch 203 is closed, power from source 202 is delivered to a power (PWR) terminal 204 which is distributed throughout the circuitry for operating certain of the components thereof. This power available at terminal 204 is used for the nonmemory components of the circuit.

The critical, memory components of the circuitry, which must be continuously supplied with operating power in order to retain the digital memory thereof, are supplied by a memory battery (BAT) terminal 206.

During normal operation when sufficient power is available from source 202 for operating the circuitry, both power terminal 204 and memory battery terminal 206 are supplied from source 202 by a forward bias diode 207. The voltage output from source 202 is continuously monitored by a transistor circuit including transistor 208, diode 209, resistor 211 and a base input resistor 212 connected across a memory battery 213. Memory battery 213 will supply the necessary operating power to insure memory retention of the digital storage circuitry, in the event of loss of power from source 202.

During normal operation, power source 202 is isolated from memory battery 213 by a reverse bias diode 214. Upon loss of power from source 202, diode 214 becomes forward biased and memory battery 213 supplies power to terminal 206, while diode 207 becomes reverse biased so as to isolate the memory power circuit at terminal 206 from the remaining power cirucitry at terminal 204. A filter capacitor 216 smooths out any transients in the power source including any transients due to switching from source 202 to memory battery 213. It will be noted that the memory battery terminal 206 is applied to and for operating the shift register stages 126 through 130, counter 87 of the time-based counter circuit 85, one-shot multivibrator device 103, the start multivibrator device 81 and column drive counter 186. These components and associated circuits must continue to receive operating power in order to retain the digital temperature versus time information recorded from a prior over-temperature event. On the other hand, the source voltage for circuit 221 of the voltage divider for converter 31, and the source voltage for comparator networks 41 through 45, the reset circuit including switch 176, and power for matrix 13 at terminal 222 may all be operated from the normal source 202 supplied by terminal 204. Loss of operation of these latter components will not cause loss of the memorized digital temperature and time data.

Circuit 201 also serves the important function of blocking further entry of digital temperature data after loss or diminishment of power source 202. Only so long as power source 202 remains at its expected level, analog-to-digital converter 31 accurately and validly converts this temperature signal into the proper digital word. It is undersirable to continue entering digital data into storage 62 after diminshment or loss of power at source 202, as such data may be invalid.

Accordingly, transistor 208 of circuit 201 continuously compares the power output from source 202 with the reference voltage available from memory battery 213 and applied to the base of the transistor through resistor 212. If the voltage from source 202 drops below a predetermined level, battery 213 reverse biases transistor 208, the transistor turns off, causing the voltage across voltage 211 to go low. This low going logic condition is transferred through resistor 223 and inverter 224 to clock generator 71 and device 81 for terminating the operations thereof. More particularly, the output of inverter 224 is connected to an input 226 of a NAND gate 227 for disabling gate 74 of clock generator 71 when column counter 186 reaches its last counting state represented by output line 228. Counter output line 228 is connected to the other input 229 of gate 227 so that the disablement and termination of the operation of counter 71 occurs at a designated state of counter 186, namely the last counting state thereof. This is so that the circuitry is not disabled during the middle of a sweep of matrix 13, a result which would cause an undesirable drain on memory battery 213 by reason of continuous energization of one or more of the light emitting display diodes.

The output of inverter 224 is also connected to a set input 231 of start multivibrator device 81 for disabling the operation thereof in response to an over-temperature sense signal applied at input 82. Thus, by disabling device 81, further entry of temperature data into the digital storage circuitry is precluded.

In order to retrieve the digital information after a shutdown caused by loss of power at source 202, it is merely necessary to restore power to terminal 204, or apply an external clock signal to an auxiliary clocking input 232 to cause cycling of shift register 66 and synchronous operation of column drive counter 186. The outputs from these respective circuits may be monitored by external means for recording the temperature and time data, or matrix 13 may be energized at terminal 222 and the data graphically displayed thereon while continuing to apply the external clock source to input 232.

Figure 3:
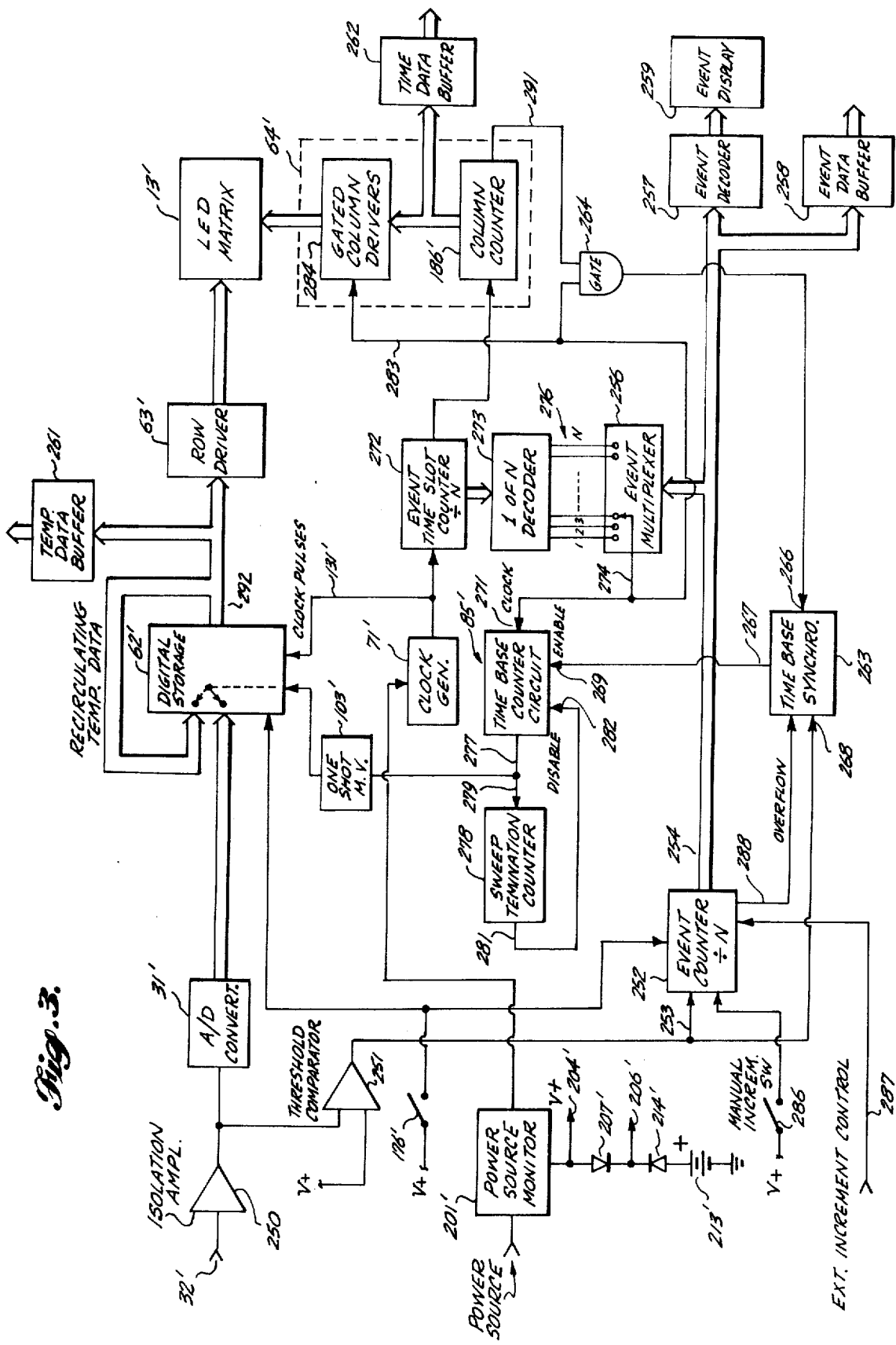
FIG. 3 is a detail block diagram of an alternative preferred embodiment of the indicator apparatus constructed and operating in accordance with the present invention.

FIG. 3 illustrates an alternative embodiment of the method and apparatus in accordance with the present invention, whereby a plurality of N over-temperature events may be sensed, recorded and visually displayed. In this figure, primed reference numerals designate corresponding unprimed components numbers of the electronic circuitry shown in FIG. 2 and described above. Thus, an analog signal representing the engine temperature is applied to an input 32', whereupon it is passed through an isolation amplifier 250 to an anlog-to-digital converter 31'. If the temperature signal applied to input 32' exhibits a plurality of over-temperature events, each successive event will be sensed, stored in digital storage 62' and visually displayed on light emitting diode matrix 13'. Moreover the number and sequence of the successive events will be registered and recorded for later retrieval along with the associated temperature and time characteristics of each such event. Up to N such events can be recorded by the instruments circuitry.

In this particular embodiment, a separate threshold comparator 251 is connected to the analog temperature signal at the output of isolation amplifier 25, in lieu of using one of the comparators forming the analog-to-digital converter as in the case of the embodiment described above. Each time comparator 251 senses the commencement of an over-temperature event by reason of the engine temperature exceeding the over-temperature threshold, an output from comparator 251 is applied as a clock input to an event counter 252. Event counter 252 serves to register the number of successively over-temperature events for controlling the location of the temperature and time data associated with each such event. Clocking of counter 252 is achieved by applying the output of comparator 251 to a counter input 253 as illustrated. An output 254 of counter 252 is applied to an event multiplexer circuit 256 serving as a means for controlling the storage of data in storage 62 and for synchronously operating LED matrix 13' therewith, and to an event decoder 257 and an event data buffer 258.

Event decoder 257 drives an event display 259 for visually indicating a symbol or number uniquely representing each over-temperature event. Display 159 may be mounted adjacent or within the instrument panel carrying LED matrix 13' for indicating the number of the event presently being displayed on the matrix.

Similarly an event data buffer 258 may be provided as shown and described for providing an external data retrieval point on the instrument enabling external recoding of the event data together with the associated temperature and time data available from buffers 261 and 262 respectively.

The output of threshold comparator 251 also is applied to a time-based synchronization circuit 263 which serves a function similar to start bistable multivibrator device 81 in the embodiment of FIG. 2. Synchronization circuit 263 serves to synchronize the operation of time-based circuit 85' with the column sweep signal determined by column counter 186' of column driver 64' and with an output from event multiplexer 256 via a gate 264. For this purpose a clock input 266 of time-based synchronization circuit 263 serves a similar function to clock input 83 of device 81 of FIG. 2, causing an enable signal from output 267 the moment that input 266 is clocked by the coincidence of an output from column counter 186 and an output from event multiplexer 256, actuating gate 264. This clocking of synchronization circuit 263 following a prior enable signal at input 268 from threshold comparator 251 at the commencement of an over-temperature event, synchronizes the start of time-based counter circuit 85' at an enabling input 269 thereof in response to the aforementioned coincidence of an output from multiplexer 256 and a particular sweep position of column counter 186'.

More particularly, time-based counter circuit 85' is clocked at an input 271 by event multiplexer 256 which issues an output pulse once over Nth number of clock pulses received from generator 71'. Moreover the phase timing of the output of multiplexer 256 is varied in accordance with the particular one of the N possible events being recorded or displayed. This effectively synchronizes the time-based counter circuit 85' so as to cause the recording and retrieval of data from digital storage 62' in unique time slots, each slot associated with a particular one of the N events. For this purpose, the output of clock generator 71' in addition to clocking the shift registers of digital storage 62' directly, over line 131', is connected to an event time slot binary counter 272 having the output states thereof connected to a one out of N decoder 273. Event multiplexer 256 serves to electronically communicate or connect an output 274 therefrom to one of the N outputs from decoder 273, as determined by the instantaneous state of event counter 252. In other words, output 274 will issue an output pulse every Nth clock pulse from generator 71', with event multiplexer 256 determining the phase of such pulse at output 274 as a function of the particular event currently registered by counter 252.

As an example of this operation, assume that the system is capable of recording 8 events such that N = 8. Thus, event time slot counter 272 divides the clock signal from generator 71' by 8. One out of N decoder 273 will have 8 output lines as indicated at 276. Event multiplexer 256 will connect output 274 therefrom to each of such 8 output lines at 276, in succession, and in sequence to the accummulation of 8 events as registered by event counter 252. Thus, for event No. 1 counter 252 will assume its first counting state, and will cause event multiplexer 256 to connect output 274 to the No. 1 output line from decoder 273. On the first pulse from generator 271 output line No. 1 from decoder 273 will be energized. This will apply a clock pulse to clock input 271 of time-based counter circuit 85'. After 8 more such clock pulses from generator 71', line No. 1 will again be energized, sending another clock pulse to time-based counter 87'. This operation proceeds in a manner described more fully hereinafter to record and display the temperature and time data associated with the first or No. 1 event.

Now assume that event counter 252 has detected a second over-temperature event and has advanced to its second state. This will cause multiplexer 256 to select the second or No. 2 output line from decoder 273. Clock generator 71 then issues another sucession of 8 pulses. This time, the output 274 will be energized on the second pulse of this sequence, rather than on the first pulse as in the case of the first or No. 1 event. Thus the second event is recorded in digital storage 62' and displayed on matrix 13'. Similarly the third, fourth, fifth, sixth, seventh and eighth events cause event multiplexer 256 to change the timing or phase of the output 274 in accordance with the 8 or N outputs of decoder 273.

Referring now to time-based counter circuit 85', it receives the succession of output pulses from multiplexer 256 and divides these pulses by a factor of $8n + 1$ as in the case of counter 87 of FIG. 2.

At the end of the $8n + 1$ pulses marked off by the time-based counter circuit 85', an output 277 thereof switches state and triggers one-shot multivibrator 103' to cause entry of the digital temperature word available on converter 31' into digital storage 62'. Each time output 277 triggers multivibrator device 103', the circuit is reset in accordance with the above-described operation of time-based counter 87 of FIG. 2. Moreover, the succeeding counting cycle of the circuit advances the time-based slot by the amount of one additional clock pulse from output 274 of multiplexer 256, thus shifting the storage location within digital storage 262' to a new and unique position for receiving the new temperature data.

In order to terminate the operation of time-based counter circuit 85' after the time span of matrix 13' has been exceeded, a sweep termination counter 278 is provided. Sweep termination counter 278 has an input 279 responsive to the succession of data entry pulse outputs from the time-based counter circuit. After accumulating a predetermined number of such output pulses, counter 278 issues a disabling signal at outpupt 281 which is applied to a disable input 282 of the time-based counter circuit 85' for disabling further operation thereof in response to clock pulses received at input 271.

In this particular embodiment, matrix 13' has a 7 column time span corresponding to zero to six seconds as indicated above. Accordingly, counter 278 may be a divide-by-eight counter, issuing the disable signal at output 281 after 8 successive data entry pulses received from output 277. Further temperature data occurring during the same over-temperature event is not recorded, and the time-based counter circuit will remain disabled until a new over-temperature condition has been sensed by comparator 251. As indicated above, sufficient temperature information can be obtained during the first 6 seconds of the over-temperature incident, and further recording and display of the same event for more than 6 seconds is usually unwarranted. It will be apparent however, that the system can be adapted to expand the memory of storage 62' and its associated circuitry, and provide commensurate expansion of the time-base of LED matrix 13'.

The one out of N clock pulses developed at output 274 from multiplexer 256 are also fed over a connecting line 283 for enabling or strobing gated column drivers 284. Drivers 284 must be strobed at the occurrence of the one out of N pulses developed by multiplexer 256 in order to display only that temperature data available from storage 62' and row driver 63' associated with the particular over-temperature event being recorded or retrieved. Thus, column counter 186' enables the appropriate columns of diode matrix 13', while gated column drivers 284 in response to the strobe pulses over line 283, cause the appropriate diode columns to be energized at time associated with the particular over-temperature event being recorded or retrieved from storage 62'.

In this manner the circuitry of FIG. 3 functions to continuously cycle digital storage 62', and selectively position the temperature data from converter 31' at unique time slots within the shift register as a function of the time-based counter and event multiplexer. At the end of an aircraft flight or series of flights, data from digital storage 62' may be retrieved in the following manner.

For manual retrieval, a manual incrementing switch 286 is provided for manually stepping event counter 252 to cause successive positioning of event multiplexer 256 and selective interrogation of digital storage 62'. This causes time-based counter circuit 85' to be properly phased for retrieving the temperature data associated with each of the available events within counter 252. If desired, this data for each event may be passed directly to external recording equipment through the aforementioned temperature data buffer 261, time data buffer 262 and event data buffer 258.

Alternatively, an external incrementing control may be used by applying an external incrementing signal to input 287 of counter 252 for automatically stepping the counter through each of the previously recorded over-temperature events.

If the number of over-temperature events exceeds N, in other words exceeding the memory capability of the circuit, event counter 252 overflows on an output line 288 which is connected to and for disabling time-based synchronization circuit 263, preventing circuit 263 from further responding to a further over-temperature event as sensed by threshold comparator 251.

Accordingly in summary, the circuit of FIG. 3 functions to sense, digitally record and display each of a succession of over-temperature events in the following manner. Assuming that the circuitry is all reset and clock generator 71' is running, an over-temperature at input 32' trips threshold comparator 251 and sets event counter 252 to its first counting state. This in turn causes event multiplexer 256 to select decode line No. 1 from decoder 273 and concurrently time-based synchronization circuit 263 enables time-based counter circuit 85' as soon as column counter 186' overflows at output 291. This synchronizes the time-based counter circuit with the column sweep. After 8Nn + 1 clock pulses later, time-based counter circuit 85' at output 277 triggers one-shot multivibrator 103' and the temperature data available at converter 31' at that time is entered into digital storage 62'.

This data is recirculated in the shift register in synchronism with the event time slot counter 272 and the column counter 186'. Thus temperature data will be present at the shift register output 292 at the same time that column counter 186' selects matrix column 1 and event time slot counter 272 advances the stage of column counter 186' and event multiplexer 256 strobes gated column drivers 284 over line 283. The first column of LED matrix 13' and of the temperature histogram will thus be diplayed.

Because of the clock pulse phasing operation of the time-based counter circuit 85', the shift register of digital storage 62' will permit entry of the next temperature word in synchronism with the enabling of column 2 by column counter 186'. In this manner the temperature data levels are stored and displayed until the sweep termination counter 278 overflows and disables the time-based counter circuit.

Should a second over-temperature occur, this will be detected by comparator 251, advancing event counter 252 to the second state. Up to N events can thus be recorded, after which, event counter 252 overflows at output 258 inhibiting the time-based synchronization circuit 263 from further enabling the time-based counter circuit.

This operation organizes the temperature data in the shift registers of storage 62' in the form of N byte words for each matrix display column. Each byte contains the temperature data for one of the N events recorded.

As in the case of the previous embodiment, a power source monitoring circuit 201' may be provided for detecting a loss of the normal power source and enabling a memory battery 213' to continue to supply voltage to and for maintaining the memory function of the various digital logic and storage circuits.

While only a limited number of embodiments of the present invention have been disclosed herein, it will be readily apparent to persons skilled in the art that numerous changes and modifications may be made thereto without departing from the spirit of the invention. For example, the embodiments of FIG. 2 and 3 of the present invention may be modified to provide for recording of data from over-temperature events occurring in more than one aircraft engine. In such case, the over-temperature levels from the plurality of engines may be multiplexed and stored in a manner similar to the storage of temperature data from a single engine, as described more fully above. Also, the instrument circuitry may be modified to include additional logic functions for a stall condition, hot start, hung start and other special engine conditions.

Accordingly, the foregoing disclosure and description thereof are for illustrative purposes only and do not in any way limit the invention which is defined only by the following claims.

What is claimed is:

1. Apparatus for receiving an electrical signal representing a temperature condition of a jet engine and sensing, storing, and displaying an over-temperature event incurred by such engine, comprising:
an analog to digital converter means adapted to receive said electrical temperature signal and convert it to a digital temperature signal;
over-temperature sensing means responsive to said temperature signal and having an electrical output indicating that said engine has commenced an over-temperature event;
digital storage means;
electrically energized, light emitting, solid state matrix display means; and
time base generator means connected and responsive to said electrical output of said over-temperature sensing means and connected to and for conditioning said storage means to store said temperature signal at each of a plurality of time intervals in response to said over-temperature sensing means indicating the commencement of said over-temperature event, and said display means connected to said storage means and to said time base generator means for graphically displaying said stored temperature signals as a function of time.

2. The apparatus as defined in claim 1, wherein said display means comprises:
a light emitting diode matrix including a plurality of rows and columns of diodes being selectively energized by said storage means and said time base generator means to graphically represent said temperature signals as a function of time, and said digital storage means including means for energizing all said diodes representing a temperature signal equal to and less than said stored temperature signal for each said time interval, whereby said diode matrix presents a histogram graph of said over-temperaature as a function of time.

3. The apparatus of claim 1, wherein said analog to digital converter means includes parallel multiple bit outputs; and said digital storage means includes a plurality of parallel recirculating shift register stages, one for each said bit output; and said time base generator means includes a clock generator connected to and for continuously clocking said plurality of shift register stages with a succession of clock pulses, whereby said digital temperature signal is fed as a multiple bit digital signal to and for storage in said plurality of shift register stages.

4. The apparatus of claim 3, wherein said display means comprises a plurality of light emitting diodes arranged in multiple rows and columns defining temperature and time axes of a matrix; said diodes being connected for selective electrical energization along said temperature axis by said shift register stages; and an electrical driver having an input connected to said time base generator means and having a plurality of outputs connected to and for selective electrical energization of said diodes along said time axis at said time intervals.

5. The apparatus of claim 3, said digital storage means further including data entry control gate means connected between said converter means outputs and said shift register stages; and said time base generator means further including a time base counter circuit means connected to said clock generator and to said data entry control gate means for conditioning said gate means to enter said digital temperature signal from said converter means into said shift register stages upon counting a predetermined number of said clock pulses plus one additional said clock pulse; whereby said time base counter circuit means serves to shift said register stages by said predetermined number plus one state each time a new digital temperature signal is stored in said recirculating shift register stages to provide a unique storage location in said digital storage means for a succession of said digital temperature signals.

6. The apparatus of claim 1, further comprising:
power loss sensing circuit means adapted to be connected to a source of electrical power for said apparatus; and
memory battery circuit means including an emergency battery said memory circuit means connected and responsive to said power loss sensing circuit means for connecting said emergency battery to at least said digital storage means for sustaining operation thereof after loss of said source of power for retaining all temperature signal data stored therein.

7. The apparatus as defined in claim 1, wherein said digital storage means and said time base generator means include additional means for registering each of a plurality of N over-temperature events and storing the temperature signals as a function of time in said digital storage means for each such over-temperature event.

8. The apparatus as defined in claim 1, wherein said digital storage means includes means for storing digital temperature signals at each said time interval for a plurality of successive N over-temperature events and means for counting each such N event; and said time base generator means further including event multiplexer means responsive to said means for counting each said N event for conditioning said digital storage means to store each said digital temperature signal at each of said plurality of time intervals for each said plurality of events N, whereby a plurality of over-temperature events are successively graphically displayed on said solid state matrix display means and recorded in said digital storage means.

9. The apparatus as set forth in claim 8, further comprising:
event display means connected and responsive to said means for counting said events for displaying a symbol uniquely representing each said plurality of N events.

10. An instrument adapted to be mounted on the instrument panel of a jet engine aircraft for receiving an electrical signal representing a temperature condition of one or more of the aircraft jet engines and, in response thereto, sensing, storing, and displaying an over-temperature event incurred by such jet engine, comprising:
means for receiving said electrical signal and for sensing an over-temperature represented thereby indicating that said engine has commenced an over-temperature event;
means for digitally storing the condition of said electrical signal at each of a plurality of time intervals subsequent to said means sensing said over-temperature conditon; and
solid state matrix display means connected to said means for digitally storing said electrical signal for graphically displaying the temperature of said jet engine as represented by said electrical signal as a function of time represented by said time intervals.

11. Method for sensing, storing, and displaying an over-temperature event incurred by an aircraft jet engine, comprising the steps of:
sensing an over-temperature condition of said jet engine by detecting a threshold level of an electrical signal representing the engine temperature;
storing said jet engine temperature as a digital signal at each of a plurality of time intervals following said step of sensing said over-temperature condition; and
graphically displaying said engine temperature as a function of said time intervals on a light emitting diode matrix display by selectively energizing the diodes of said display in accordance with the digitally stored temperature signal at each of said plurality of time intervals.

12. The method as set forth in claim 11, wherein said step of graphically displaying said engine temperature is further defined by selectively energizing all those diodes lying within a jet engine temperature versus time profile, so as to present a temperature versus time histogram display of said jet engine over-temperature event.

13. The method set forth in claim 11, further comprising the steps of:

detecting a plurality of successive, N over-temperature events of said jet engine and visually displaying a unique symbol for each such over-temperature event; and said step of digitally storing said jet engine temperature including the substep of digitally storing said jet engine temperature at each of a plurality of time intervals for each one of said plurality of events N; and said step of graphically displaying said over-temperature event including the substep of graphically displaying the over-temperature as a function of time for each one of said plurality of N over-temperature events in succession on said light emitting diode matrix display.

* * * * *